United States Patent
Kannengiesser et al.

(10) Patent No.: US 10,151,812 B2
(45) Date of Patent: Dec. 11, 2018

(54) MAGNETIC RESONANCE METHOD AND APPARATUS USING THE SAME MR SIGNALS FOR DETERMINING VARIOUS PARAMETERS

(71) Applicant: Siemens Aktiengesellschaft, Munich (DE)

(72) Inventors: Stephan Kannengiesser, Wuppertal (DE); Marcel Dominik Nickel, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 356 days.

(21) Appl. No.: 15/016,917

(22) Filed: Feb. 5, 2016

(65) Prior Publication Data

US 2016/0231408 A1    Aug. 11, 2016

(30) Foreign Application Priority Data

Feb. 5, 2015   (DE) .................. 10 2015 201 985

(51) Int. Cl.
*G01R 33/48*    (2006.01)
*G01R 33/50*    (2006.01)

(52) U.S. Cl.
CPC ......... *G01R 33/4828* (2013.01); *G01R 33/50* (2013.01)

(58) Field of Classification Search
CPC ........................... G01R 33/4828; G01R 33/50
See application file for complete search history.

(56) References Cited

U.S. PATENT DOCUMENTS

| | | | | |
|---|---|---|---|---|
| 7,671,590 B2* | 3/2010 | Hariharan | ......... | G01R 33/5615 324/307 |
| 2002/0067164 A1* | 6/2002 | Venkataramanan | ........................ | G01N 24/081 324/307 |
| 2002/0105326 A1* | 8/2002 | Hurlimann | ........... | G01N 24/081 324/303 |
| 2008/0125643 A1* | 5/2008 | Huisman | ................ | A61B 5/055 600/420 |

OTHER PUBLICATIONS

Kunnecke et al.: "Quantitative Body Composition Analysis in Awake Mice and Rats by Magnetic Resonance Relaxometry"; Obes. Res. vol. 12; pp. 1604-1615: (2004).

(Continued)

*Primary Examiner* — Rodney Bonnette
(74) *Attorney, Agent, or Firm* — Schiff Hardin LLP

(57) ABSTRACT

In a method and apparatus for quantitative magnetic resonance (MR), MR signals of a subject volume are acquired using various values of at least one acquisition parameter. First and second functions are respectively specified, by which an MR signal can be determined, depending on a first parameter and the at least one acquisition parameter, and depending on a second parameter and the at least one acquisition parameter. First and second subsets of the MR signals are determined respectively for the first parameter and the second parameter. The first subset differs from the second subset. The first and second parameters are determined respectively such that MR signals calculated using the first function correspond as closely as possible to the MR signals of the first subset, and MR signals calculated using the second function correspond as closely as possible to the MR signals of the second subset.

17 Claims, 5 Drawing Sheets

(56) References Cited

OTHER PUBLICATIONS

Levin et al.: "Effect of Echo-Sampling Strategy on the Accuracy of Out-of-Phase and In-Phase Multiecho Gradient—Echo MRI Hepatic Fat Fraction Estimation", in: J. Magn. Reson. Imaging, vol. 39, pp. 567-575 (2014).

Liu et al.: Rapid simultaneous acquisition of T1 and T2 mapping images using multishot double spin-echo EPI and automated variations of TR and TE (ms-DSEPI-T12). NMR Biomed., vol. 23, pp. 97-104; (2010).

\* cited by examiner

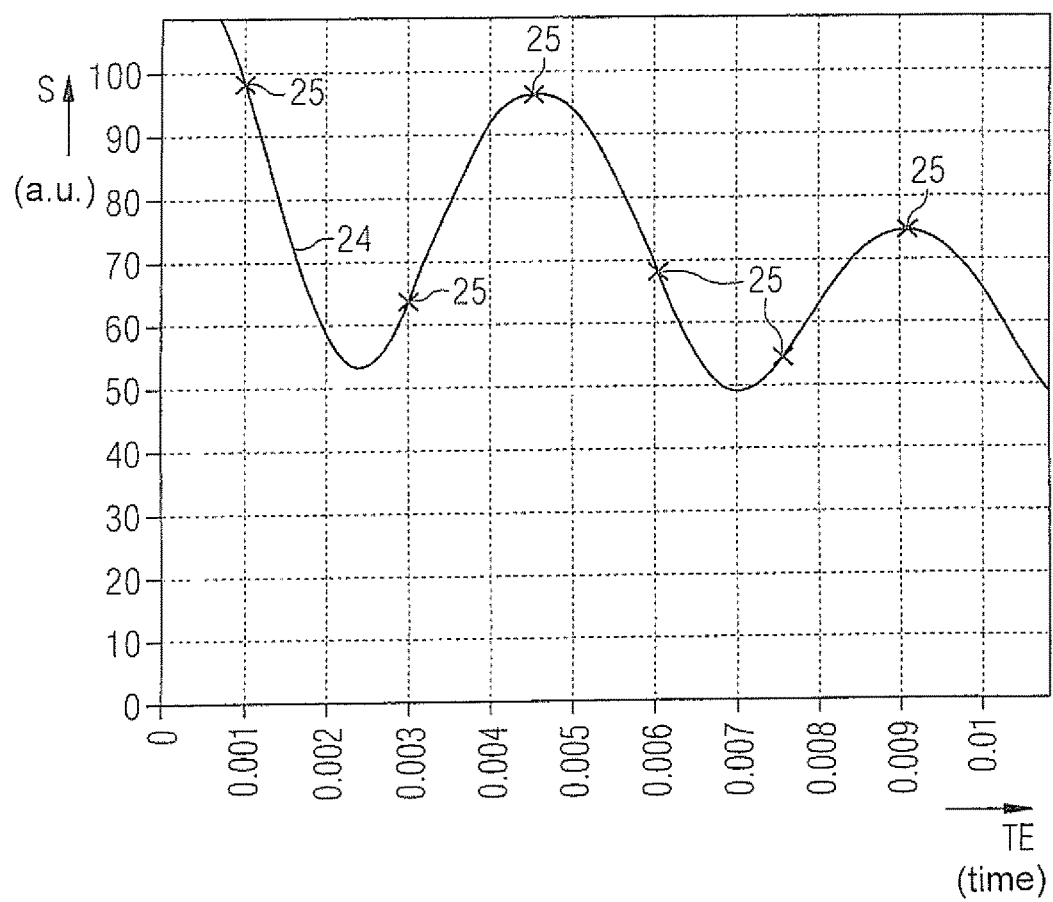

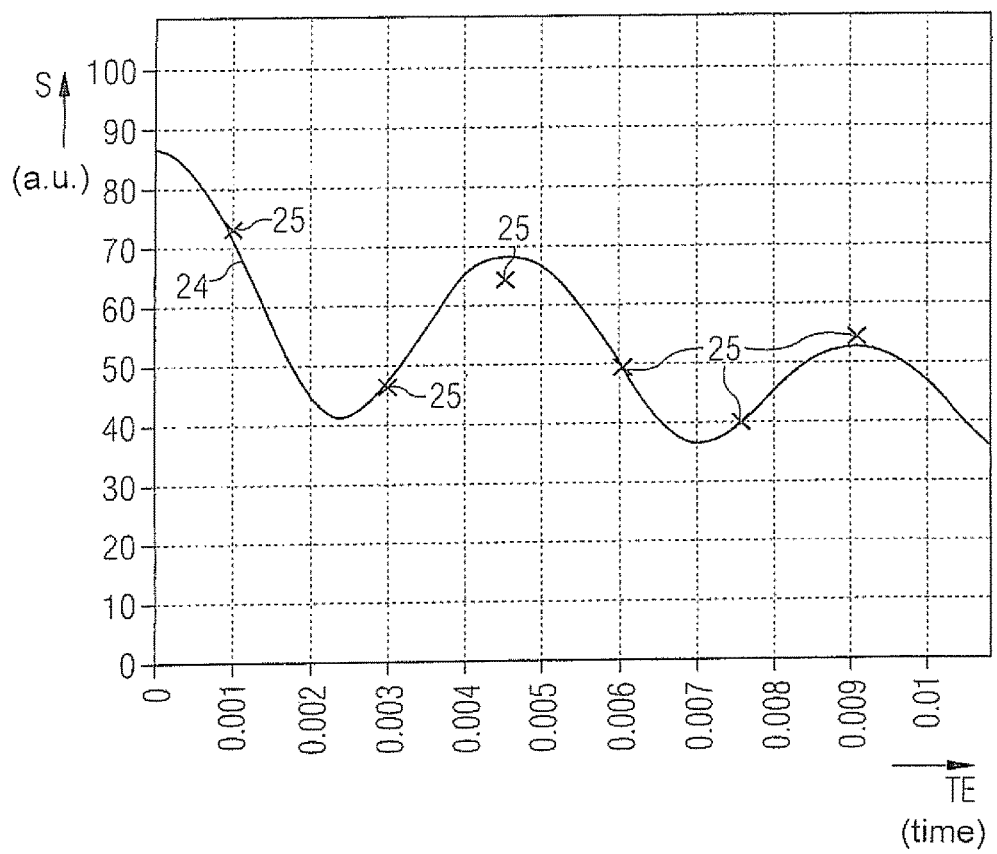

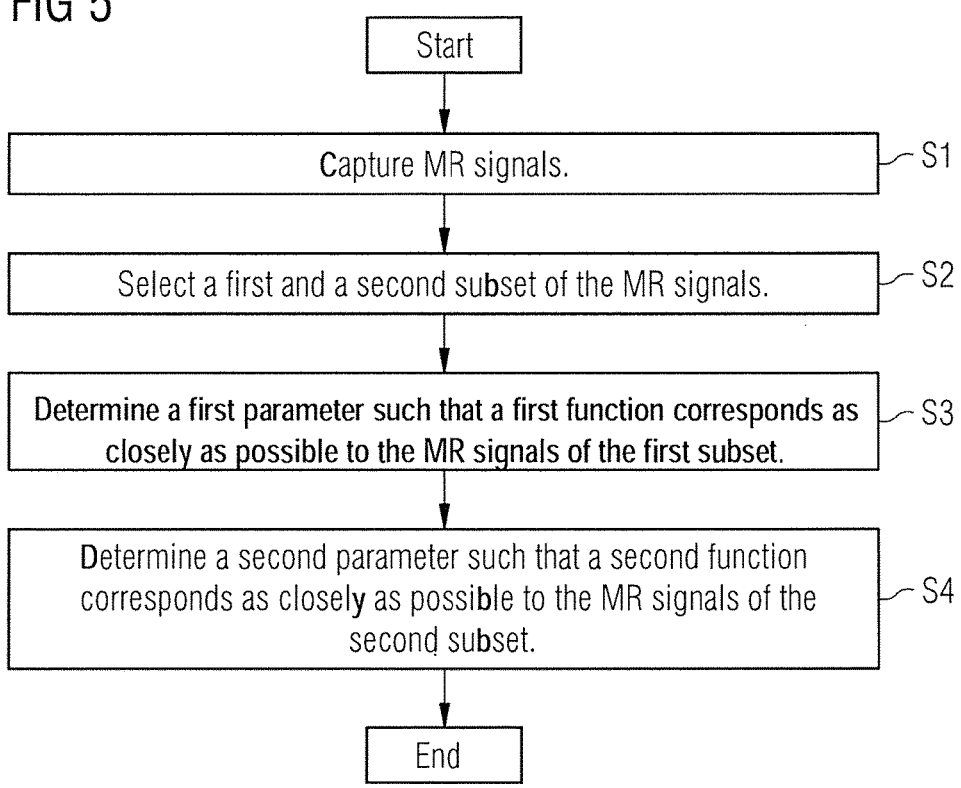

MAGNETIC RESONANCE METHOD AND APPARATUS USING THE SAME MR SIGNALS FOR DETERMINING VARIOUS PARAMETERS

BACKGROUND OF THE INVENTION

Field of the Invention

The present invention concerns the determination, in particular the quantitative determination, of various parameters in a volume section by the operation of a magnetic resonance apparatus.

Description of the Prior Art

For the purpose of determining specific parameters of a volume section by the operation of a magnetic resonance apparatus, also referred to as quantitative MR, use is made of a signal model or a function that is adapted to the measured data or measured MR signals. In the case of fat/iron quantification in the liver, for example, such a function includes the water signal, the fat signal and a relaxation rate (for determining the iron content) as unknown parameters. Furthermore, such a function requires a number of assumptions, such as e.g. the dephasing characteristics of the fat signal or the shared effective relaxation rate for water and fat. Each assumption or each parameter that does not correspond to reality leads to distorted results in this case.

According to "Effect of echo-sampling strategy on the accuracy of out-of-phase and in-phase multiecho gradient-Echo MRI hepatic fat fraction estimation", Y. S. Levin et al., Journal of Magnetic Resonance Imaging, volume 39 (3) 2014, pages 567-575, a small number of rapidly captured MR signals with short echo times give more accurate results during fat quantification than when more MR signals are captured with short and long echo times during a slow measurement. However a small number of rapidly captured MR signals are not the appropriate choice for determining all parameters. When determining the relaxation rate, for example, it can be advantageous also to use MR signals with long echo times.

In other words, the number of MR signals to be captured, and the way in which they are used, depends in each case on the parameter to be determined. When determining multiple parameters on the basis of the same measured MR signals, this parameter dependency of the signals to be captured represents a problem.

SUMMARY OF THE INVENTION

An object of the present invention is to determine multiple parameters on the basis of the same captured MR signals while nonetheless taking into consideration the previously described parameter dependency of the captured MR signals.

In the context of the present invention, a method is provided for determining a first parameter and a second parameter in a volume section of an examination object with the operation of a magnetic resonance apparatus. The inventive method has the following steps. Multiple MR signals of the volume section are acquired with the scanner of the apparatus using various different values of at least one acquisition parameter. Therefore, multiple MR signals per voxel are acquired in this step, wherein each of these MR signals differs from the other MR signals of the same voxel on the basis of the different values of the at least one acquisition parameter (e.g. the echo time). A first signal model or a first function is specified in a computer, by which an MR signal can be determined or calculated depending on the first parameter and the at least one acquisition parameter. A second signal model or a second function is also specified in the computer, by which an MR signal can be determined or calculated depending on the second parameter and the at least one acquisition parameter. A first subset of the MR signals is determined in the computer in order to determine the first parameter on the basis of this first subset. In this step, from all of the MR signals acquired for a specific voxel, some (or all) of the previously acquired MR signals are selected, and these then correspond to the first subset. The computer also determines or selects a second subset of the MR signals, in order to determine the second parameter on the basis of this second subset. In this step, in a similar manner to the preceding step for determining the first subset, some (or all) of the previously captured MR signals are selected and assigned to the second subset. The first subset differs from the second subset in this case. In other words, at least one of the measured MR signals is either only in the first subset or only in the second subset. The computer determines the first parameter with the use of the first function and the first subset of MR signals. In this case, the first parameter is determined such that the MR signals calculated by the first function for the determined first parameter correspond as closely as possible to the measured MR signals of the first subset. The computer determines the second parameter with the use of the second function and the second subset of the MR signals such that the MR signals calculated by means of the second function for the determined second parameter correspond as closely as possible to the measured MR signals of the second subset. The first and second parameters are made available from the computer in electronic form.

When determining the first or second parameter, the first or second parameter is determined such that the "goodness of fit" is as high as possible or any error is as small as possible. In this case, the goodness of fit indicates how well the values that were calculated with the use of the first or second function, depending on the at least one acquisition parameter and the first or second parameter, correspond to the corresponding measured values of the MR signals of the first or second subset respectively. In other words, the parameters are determined by a model fit, which allows the corresponding function to be adapted as closely as possible to the measured MR signals of the corresponding subset. In addition to the first and second parameters, it is possible to determine a further parameter or a number of further parameters on the basis of the measured MR signals, specifically by forming a further subset, from the measured MR signals, for each further parameter and then determining the further parameter by a further function and this further subset.

According to the invention, the MR signals of the first subset are used when determining the first parameter and the MR signals of the second subset are used when determining the second parameter, and it is therefore possible to selectively use those measured MR signals that are most suitable for determining the first and second parameter respectively. This means that the MR signals measured by the same measurement can be used in an optimum manner to determine various parameters of the volume section.

According to an embodiment, the first function and the second function may be the same function. In this case, an MR signal can be calculated by this function depending on the first parameter, the second parameter and the at least one acquisition parameter. The first subset of the MR signals is used to determine the first parameter and the second subset of the MR signals is used to determine the second parameter in this case.

According to a preferred variant of this embodiment, the MR signals are captured with various echo times TE. The function used in this case satisfies the following equation:

$$S(TE)=(W+c(TE)\times F)\times e^{-TE\times R2^*} \qquad (1),$$

where S corresponds to the MR signal, W to the water signal, F to the fat signal, R2* to the transverse relaxation rate, and c(TE) to an echo-time-dependent modulation of the fat signal. This modulation or function of the fat signal c(TE) may be established in advance by a calibration measurement, for example.

If the first parameter corresponds to the fat signal, those measured MR signals whose echo time is less than a predetermined echo-time threshold value are preferably assigned to the first subset. Alternatively, it is also possible without using an echo-time threshold value simply to assign a predetermined number (e.g. 4) of the measured MR signals with the shortest echo time to the first subset. The fat fraction FF can then be determined on the basis of the following equation:

$$FF=F/(W+F) \qquad (2).$$

As a result of using only early echoes (MR signals with a comparatively short echo time) for the purpose of determining the fat signal (and therefore the water signal) and therefore the fat fraction, the signal noise ratio for these echoes or MR signals is relatively high. Since the signal noise ratio for these MR signals is high, it is preferable to use only the magnitudes of the MR signals for the purpose of determining the fat signal.

If the second parameter corresponds to the relaxation rate, which correlates linearly to the iron fraction, the second subset includes all of the measured MR signals if possible. For the purpose of determining the second parameter or the relaxation rate in this case, the MR signals are advantageously treated as complex values, thereby allowing the noise component to be eliminated more effectively.

A further way to determine the second subset for the relaxation rate is to assign to the second subset only those measured MR signals which lie close to the maxima (minima) of the function S(TE). In this case, a (local) maximum corresponds to an echo time at which the fat signal and the water signal are in phase, while a (local) minimum corresponds to an echo time at which the fat signal and the water signal have opposite phases.

According to another embodiment, a further relaxation rate can be determined. For this purpose, within the MR signals of the original second subset, those MR signals that were captured with a longer echo time are removed from the second subset, such that only MR signals with a (comparatively) shorter echo time are used to determine the further relaxation rate. The determination of the further echo time is performed using the same inventive procedure as described previously for the determination of the relaxation rate, only the reduced second subset is used instead of the original second subset. Following thereupon, the error (or the goodness of fit) of the MR signals as calculated by the function depending on the determined further relaxation rate is determined for the measured MR signals of the reduced second subset. The error (or the goodness of fit) of the MR signals as calculated by the function depending on the relaxation rate is then determined for the measured MR signals of the original second subset. Only if the error (the goodness of fit) for the further relaxation rate is smaller (greater) than the error (the goodness of fit) for the relaxation rate, is the further relaxation rate determined as the relaxation rate.

For the purpose of determining the first and/or second subset, the partial derivative of the corresponding (i.e. first or second) function may be used according to a function parameter. The function parameter is preferably the first or the second parameter. However, the function parameter that is used for the partial derivative may also be the acquisition parameter (if there is only one acquisition parameter) or one of the acquisition parameters, or another term of the first or second function. For this purpose, the first (second) subset only includes those measured MR signals for which the partial derivative of the first (second) function according to the function parameter (preferably the first (second) parameter) is less than a predetermined derivative threshold value, such that the partial derivative of the first (second) function according to the function parameter is less for the MR signals of the first (second) subset than it is for the remaining measured MR signals.

For the purpose of determining the first and/or second subset, it is also possible to determine an error or a goodness of fit exhibited by function values of the corresponding (i.e. first or second) function in relation to the captured MR signals. For this purpose, the first (second) subset only includes those measured MR signals that exhibit an error that is less than a predetermined error threshold value.

For example, an estimated first (second) parameter may be used for the purpose of determining the first (second) subset. For each measured MR signal, an MR signal is now calculated depending on this first (second) parameter. If the difference (the error) between the measured MR signal and the calculated MR signal is less than the predetermined error threshold value, the MR signal is included in the first (second) subset. As a criterion for the choice or determination of the respective subset, it is therefore possible to use an a-posteriori method which works with e.g. the error described above or a residual fit error.

The at least one acquisition parameter may be one or more of the following parameters:
- The echo time TE, i.e. the time span between the instant of the HF excitation and the instant at which the corresponding MR signal is captured.
- The inversion time TI, i.e. the time span between the instant of the inversion pulse and the instant at which the HF excitation pulse for capturing the MR signals is applied.
- The "b-value" of a diffusion-weighted MR experiment. The diffusion gradient moment of the MR experiment is determined on the basis of the b-value in this case.

The present invention also encompasses a magnetic resonance apparatus for determining a first parameter and a second parameter in a volume section of an examination object. The magnetic resonance apparatus has a scanner with a basic field magnet, a gradient field system, at least one RF antenna, and a control computer for activating the gradient field system and the at least one RF antenna, for receiving measured signals that are picked up by the RF antenna(s) and for evaluating the measured signals. The control computer is configured such that the scanner captures measured signals or MR signals of the volume section using various values of at least one acquisition parameter. A first function and a second function are specified in this case. The first function can be used to determine an MR signal depending on the first parameter and the at least one acquisition parameter, while the second function can be used to calculate an MR signal depending on the second parameter and the at least one acquisition parameter. From the measured MR signals, the computer of the magnetic resonance apparatus selects a first subset for the first parameter and a second subset for the second parameter. The computer determines the first parameter such that MR signals calculated using the first function correspond as closely as possible to the MR signals of the first subset, and the computer of the magnetic resonance apparatus determines the second parameter such that MR signals calculated using the second function correspond as closely as possible to the MR signals of the second subset.

The advantages of the inventive magnetic resonance apparatus essentially correspond to the advantages of the inventive method, which were previously explained.

The present invention also encompasses a non-transitory, computer-readable data storage medium encoded with programming instructions, which can be loaded into a memory of a programmable control computer or a processor of a magnetic resonance apparatus. Using this program code, it is possible to execute all or various previously described embodiments of the inventive method when the program code is executed in the computer. The program code may require programming aids in this case, e.g. libraries and help functions, in order to realize the corresponding embodiments of the method. The program code may be source code (e.g. C++) which has yet to be compiled (translated) and linked, or which only needs to be interpreted, or executable software code which only needs to be loaded into the corresponding computer or processor for execution.

The electronically readable data medium may be a DVD, a magnetic tape, a hard disk or a USB stick, on which electronically readable control information is stored.

With the present invention, the same captured MR signals can be used to determine multiple parameters of interest for each voxel of the examined volume section. For this purpose, for each parameter, those MR signals which are optimal for determining the respective parameter are selected from the measured MR signals and assigned to the subset which is assigned to the respective parameter. The respective parameters can therefore be determined more effectively or more accurately, since e.g. those MR signals which would lead to confusing results when determining the respective parameter are not included in the corresponding subset. This means that determining the parameters in accordance with the invention provides the most accurate and stable result possible.

In this way, the present invention also solves the issue that is unresolved by the prior art with respect to which echoes should be captured for the concurrent determination of the fat fraction and the iron fraction, since the optimal subset of the captured MR signals is created in each case for determining the fat and the iron, respectively.

BRIEF DESCRIPTION OF THE DRAWINGS

FIGS. 2 to 4 each show MR signals of the same voxel over the echo time.

FIG. 5 shows a flowchart of a method according to the invention.

DESCRIPTION OF THE PREFERRED EMBODIMENTS

Figure 1:
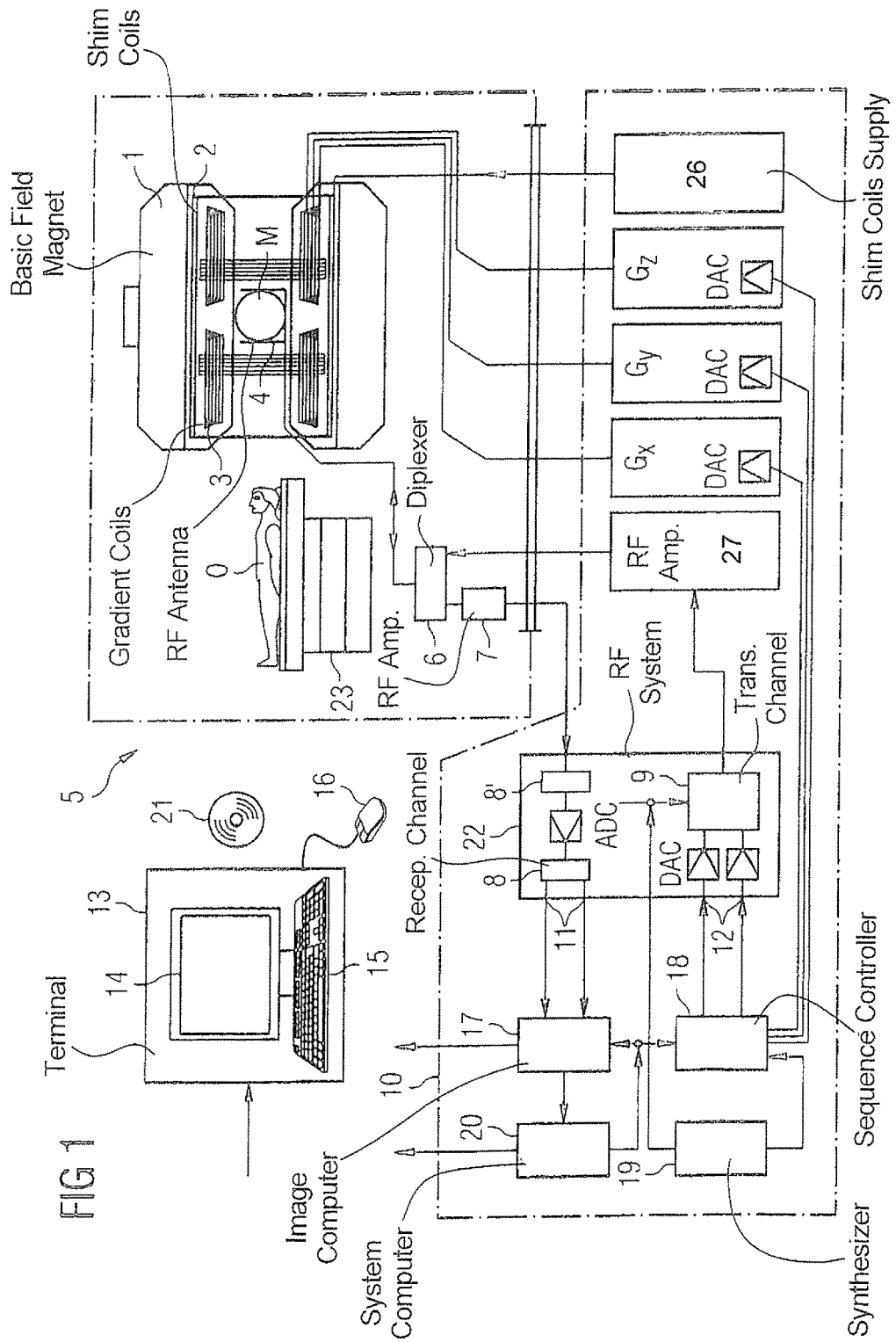
FIG. 1 schematically shows a magnetic resonance apparatus according to the invention.

FIG. 1 is a schematic illustration of a magnetic resonance scanner 5 (magnetic resonance imaging device or nuclear spin tomography device) according to the invention. In this case, a basic field magnet 1 generates a temporally constant, strong magnetic field that polarizes and/or aligns nuclear spins in an examination region of an object O, e.g. part of a human body to be examined, which is examined while lying on a table 23 in the magnetic resonance scanner 5. The high degree of homogeneity of the basic magnetic field, which is required for the magnetic resonance measurement, is defined in a typically spherical measuring volume M in which the volume section f the human body to be examined is arranged. In order to satisfy the homogeneity requirements, and in particular to eliminate temporally invariable influences, so-called shim plates of ferromagnetic material are attached at suitable positions. Temporally variable influences are eliminated by shim coils 2, fed by a shim coils supply 26.

A cylindrical gradient field arrangement 3 composed of three sub-windings is installed in the basic field magnet 1. Each sub-winding is supplied with current by an amplifier for generating a linear (and temporally variable) gradient field in the respective directions of a Cartesian coordinate system. The first sub-winding of the gradient field system 3 generates a gradient $G_x$ in the x-direction, the second sub-winding generates a gradient $G_y$ in the y-direction and the third sub-winding generates a gradient $G_z$ in the z-direction. Each amplifier has a digital-analog converter, which is controlled by a sequence controller 18 for generating gradient pulses at the correct times.

Situated within the gradient field arrangement 3 is a radio-frequency antenna 4 (or a number thereof), which converts the radio-frequency pulses that are radiated by a radio-frequency power amplifier 27 into a magnetic alternating field for exciting the nuclei so as to cause the nuclear spins in the object O to be examined, or a region thereof to deviate from the alignment produced by the basic magnetic field. Each radio-frequency antenna 4 is composed of one or more RF transmit coils and one or more RF reception coils in an annular arrangement of component coils. This arrangement is preferably linear or in the form of a matrix. The RF receive coils of the respective radio-frequency antenna 4 also convert the alternating field originating from the precessional nuclear spins, i.e. in general the nuclear spin echo signals produced from one or more radio-frequency pulses and one or more gradient pulses by a pulse sequence, into a voltage (measured signal), which is supplied via an amplifier 7 to a radio-frequency reception channel 8 of a radio-frequency system 22. The radio-frequency system 22, which is part of a control computer 10 of the magnetic resonance scanner 5, further has a transmit channel 9 in which the radio-frequency pulses for the excitation of magnetic resonance are generated. The respective radio-frequency pulses in this case are represented digitally as a sequence of complex numbers in the sequence controller 18 on the basis of a pulse sequence specified by the system computer 20. This sequence of numbers is supplied as a real part and an imaginary part via respective inputs 12 to a digital-analog converter in the radio-frequency system 22, and from there to a transmit channel 9. In the transmit channel 9, the pulse sequences are modulated onto a radio-frequency carrier signal whose base frequency corresponds to the resonance frequency of the nuclear spins in the measuring volume.

Switching from transmit mode to receive mode is effected by a transmit/receive diplexer 6. The RF transmit coils of the radio-frequency antenna(s) 4 radiate the radio-frequency pulses for exciting the nuclear spins into the measuring volume M, and the resulting echo signals are sampled (detected) by the RF reception coil(s). The nuclear resonance signals thus obtained are demodulated in a phasesensitive manner onto an intermediate frequency in the reception channel 8' (first demodulator) of the radio-frequency system 22, digitized in the analog-digital converter (ADC), and emitted via the outputs 11. These signals are also demodulated onto the frequency zero. The demodulation onto the frequency zero and the separation into real and imaginary parts takes place in a second demodulator 8 after digitization in the digital domain. The measured data thus obtained via the outputs 11 are used by an image processor 17 to reconstruct an MR image. The management of the measured data, the image data and the control programs is performed by the system computer 20. On the basis of control program specifications, the sequence controller 18 verifies the generation of the pulse sequences that are desired in each case, and the corresponding sampling of k-space. In this case, the sequence controller 18 controls the switching of the gradients at the correct time, the emission of the high-frequency pulses with defined phase amplitudes, and the receipt of the nuclear resonance signals. The time base for the radio-frequency system 22 and the sequence controller 18 is provided by a synthesizer 19. The selection of corresponding control programs for generating an MR image, the programs being stored e.g. on a DVD 21, and the representation of the generated MR image are effected via a terminal 13 having a keyboard 15, a mouse 16 and a display screen 14.

Figure 2:
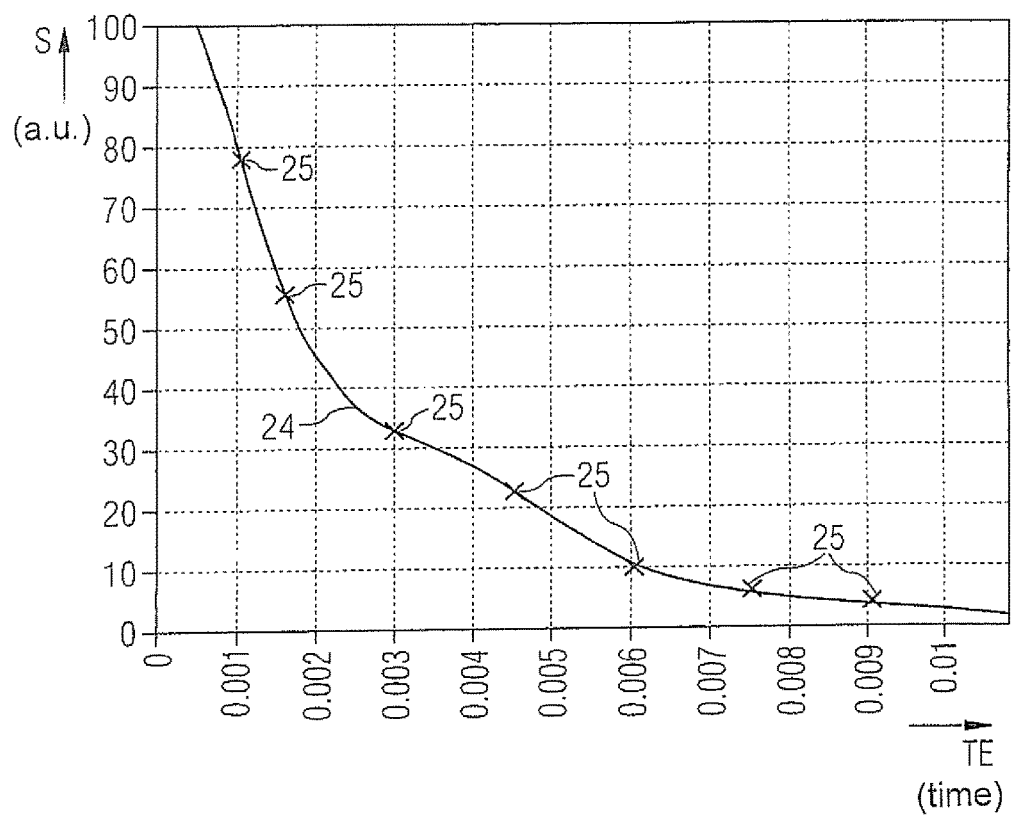

FIGS. 2 to 4 show the amplitude S of MR signals 25, in arbitrary units (a.u.) of the same voxel over the echo time TE for three different volume sections. FIGS. 2 to 4 also show the graph 24 of a function that satisfies equation (1) described above.

In the case of the function curve shown in FIG. 2, the parameters fat F and water W (and hence the fat fraction FF (cf. equation (2))), and the relaxation rate R2*, are adjusted or adapted in such a way that the curve of the function 24 corresponds as closely as possible to the measured MR signals 25. In this case, the six echoes 25 or MR signals shown in FIG. 2 give a relatively low fat fraction FF of 5.8% and a relatively high relaxation rate of 330 $s^{-1}$.

Since the fat fraction FF of the voxel for which the MR signals or echoes 25 illustrated in FIG. 3 were captured is clearly higher at 29.2% and the relaxation rate at 39 $s^{-1}$ is clearly lower than in FIG. 2, the curve of the function 24 in FIG. 3 is wavier and the drop in the amplitude S is less over the echo time TE.

In order to adapt the function 24 as well as possible to a wavy curve, the echo signals 25 used for the adaptation should lie in the vicinity of the extrema of the function curve 24. The partial derivative of the fat signal modulation c is comparatively small for the region around these extrema of the function 24, and it is therefore possible using the partial derivative to select from the set of captured MR signals those MR signals on the basis of which the function 24 and hence the parameters fat F and water W (and the relaxation time R2*) can be adapted very well to the selected measured MR signals 25, even in the case of an incorrect fat signal calibration. Moreover, for the purpose of determining the fat signal F (and the water signal W), those MR signals which were captured with a comparatively short echo time TE should preferably be assigned to the corresponding subset, since firstly the extrema are greater for this echo time range and secondly the noise component of the measured MR signals is lower.

At 26.7% and 42 $s^{-1}$ respectively, the fat fraction FF and the relaxation rate R2* of the volume section or voxel for which the MR signals illustrated in FIG. 4 were captured lie in a range that is comparable with FIG. 3. Since the function curve 24 in FIG. 4 more obviously misses a plurality of echoes 25 than in FIG. 3, the error is greater and the goodness of fit is worse in FIG. 4 than in FIG. 3.

FIG. 5 shows the flowchart of an inventive method for determining parameters.

In step S1, multiple MR signals are captured for the same voxel using various values of at least one acquisition parameter (e.g. echo time, inversion time). In other words, when capturing the first, second, third, etc. MR signals of the same voxel, different values of the at least one acquisition parameter are used in each case. The MR signals captured in the step S1 can then be revised in order to eliminate certain interference effects (e.g. noise).

In step S2, for each parameter that is to be determined, MR signals are selected from the MR signals that were captured in the step S1, and assigned to a subset which is assigned to the parameter that is to be determined in each case. In particular, the MR signals are selected in such a way in this case that the selected MR signals collectively encompass a maximum possible variation of the respective parameter, such that the selected MR signals encode as effectively as possible the information about the parameter.

Using a first function, by means of which it is possible to calculate an MR signal depending on a first of the parameters and depending on the values of the at least one acquisition parameter used in the step S1, the first parameter is determined in the step S1 For this purpose, the first parameter is adjusted such that MR signals calculated using the first function correspond as closely as possible (i.e. with the smallest possible error or best possible goodness of fit) to the calculated MR signals of the subset assigned to the first parameter.

In the step S4, using a second function, by which it is possible calculate an MR signal depending on a second of the parameters and depending on the values of the at least one acquisition parameter used in the step S1, the second parameter is determined in a similar manner.

According to the invention, it is entirely possible in further steps (which are not shown in FIG. 5) to determine further parameters on the basis of the MR signals that were captured in the step S1. For each of these parameters, a subset assigned to this parameter is determined in the step S2 in this case, and the respective further parameter is determined in a further step using a further function in a similar manner to the steps S3 and S4, by adapting the further function to the measured MR signals of the subset assigned to the further parameter.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for quantitative magnetic resonance (MR), said method comprising:
  generating control signals in a computer that define an MR data acquisition sequence and providing said control signals to an MR scanner in order to operate said MR scanner, while an examination subject is situated therein, so as to execute said MR data acquisition sequence to acquire MR signals from a volume of the examination subject using multiple values of an acquisition parameter;
  in said computer, specifying a first function by which an MR signal can be determined dependent on a naturally occurring first parameter of tissue in the examination subject, and said acquisition parameter;

also specifying a second function in said computer by which an MR signal can be determined dependent on a naturally occurring second parameter of tissue in the examination subject, and said acquisition parameter;

providing said MR signals to said computer and, in said computer, determining a first subset of the MR signals for the first parameter and determining a second subset of the MR signals for the second parameter, said first subset differing from said second subset;

in said computer, executing a calculation algorithm that determines said first parameter so as to cause MR signals calculated using the first function to correspond as closely as possible to said MR signals of the first subset and that determines said second parameter to cause MR signals calculated using said second function to correspond as closely as possible to the MR signals of the second subset; and in said computer, generating at least one of a first numerical value representing said first parameter and a second numerical value representing said second parameter, and presenting at least one of said first numerical value and said second numerical value at a display screen in communication with said computer.

2. A method as claimed in claim 1 wherein said first function and said second function are the same, and wherein an MR signal can be determined by the same function depending on the first parameter, the second parameter and the acquisition parameter.

3. A method as claimed in claim 2 comprising operating said MR scanner with an MR data acquisition sequence in which multiple echo times TE are produced, and acquiring the MR signals respectively in said multiple echo times TE; and wherein said same function is $$S(TE)=(W+c(TE)\times F)\times \exp(-TE\times R2^*)$$

wherein S is the MR signal, W is a water signal, F is a fat signal, R2* is a relaxation rate of nuclear spins in the examination subject that produced the MR signal, and c(TE) is a fat function that is dependent on the echo time.

4. A method as claimed in claim 3 comprising, in said computer, determining said first subset to comprise MR signals, among the acquired MR signals, that are acquired during a short echo time, and wherein said first parameter corresponds to the fat signal, and comprising determining a fat function FF in said computer as $$FF=F/(W+F).$$

5. A method as claimed in claim 4 comprising determining said second subset to comprise all of the acquired MR signals, and wherein said second parameter corresponds to the relaxation rate.

6. A method as claimed in claim 5 wherein the relaxation rate to which the second parameter corresponds is an initially determined relaxation rate, and comprising:

repeating determination of said second parameter in order to determine a further relaxation rate wherein a predetermined number of the acquired MR signals, which were acquired with a longest echo time, are removed from the second subset before determining said further relaxation rate; and making said second parameter correspond to said further relaxation rate if an error of said same function for said further relaxation rate, relative to the MR signals of the second subset, is less than an error of the same function for a remainder of the MR signals, and otherwise using the initially determined relaxation rate as said second parameter.

7. A method as claimed in claim 1 comprising:

determining said first subset to comprise MR signals, among said acquired MR signals, for which a partial derivative of the first function with respect to a first function parameter is less than said partial derivative for remaining MR signals among said acquired MR signals, said first function parameter being selected from the group consisting of said first parameter, said acquisition parameter, and a term of said first function.

8. A method as claimed in claim 1 comprising:

determining said second subset to comprise MR signals, among said acquired MR signals, for which a partial derivative of the second function with respect to a second function parameter is less than said partial derivative for remaining MR signals among said acquired MR signals, said second function parameter being selected from the group consisting of said second parameter, said acquisition parameter, and a term of said second function.

9. A method as claimed in claim 1 comprising:

determining said first subset to comprise MR signals, among said acquired MR signals, for which a partial derivative of the first function with respect to a first function parameter is less than said partial derivative for remaining MR signals among said acquired MR signals, said first function parameter being selected from the group consisting of said first parameter, said acquisition parameter, and a term of said first function; and determining said second subset to comprise MR signals, among said acquired MR signals, for which a partial derivative of the second function with respect to a second function parameter is less than said partial derivative for remaining MR signals among said acquired MR signals, said second function parameter being selected from the group consisting of said second parameter, said acquisition parameter, and a term of said second function.

10. A method as claimed in claim 1 comprising:

determining said first subset dependent on an error exhibited by function values of said first function with respect to the acquired MR signals, with MR signals, among the acquired MR signals, that exhibit an error that is larger than a predetermined error threshold value not being included in said first subset.

11. A method as claimed in claim 1 comprising:

determining said second subset dependent on an error exhibited by function values of said second function with respect to the acquired MR signals, with MR signals, among the acquired MR signals, that exhibit an error that is larger than a predetermined error threshold value not being included in said second subset.

12. A method as claimed in claim 1 comprising:

determining said first subset dependent on an error exhibited by function values of said first function with respect to the acquired MR signals, with MR signals, among the acquired MR signals, that exhibit an error that is larger than a predetermined error threshold value not being included in said first subset; and determining said second subset dependent on an error exhibited by function values of said second function with respect to the acquired MR signals, with MR signals, among the acquired MR signals, that exhibit an error that is larger than a predetermined error threshold value not being included in said second subset.

13. A method as claimed in claim 1 comprising generating said control signals in said computer in order to operate said MR scanner to acquire said MR signals by executing said MR data acquisition sequence so as to produce echo times are produced, during which said MR signals are acquired, and wherein said acquisition parameter is the echo time.

14. A method as claimed in claim 1 comprising generating said control signals in said computer in order to operate said MR scanner to acquire said MR signals by executing said MR data acquisition sequence so as to invert a magnetization of nuclear spins in the examination object at an inversion time following a predetermined event in said MR data acquisition sequence, and wherein said acquisition parameter is the inversion time.

15. A method as claimed in claim 1 comprising generating said control signals in said computer in order to operate said MR scanner to acquire said MR signals by executing a diffusion-weighted MR data acquisition sequence as said MR data acquisition sequence in which a magnetic diffusion gradient is produced, having a b-value associated therewith, and wherein said acquisition parameter is the b-value.

16. A magnetic resonance (MR) apparatus for MR quantitative, said MR apparatus comprising:
   an MR scanner adapted to receive an examination object therein;
   a computer configured to generate control signals that define an MR data acquisition sequence and to provide said control signals to said MR scanner in order to operate the MR scanner, while the examination object is situated therein, so as to execute said MR data acquisition sequence to acquire MR signals from a volume of the examination subject using multiple values of an acquisition parameter;
   said computer being configured to specify a first function by which an MR signal can be determined dependent on a naturally occurring first parameter of tissue in the examination subject, and said acquisition parameter and to specify a second function in said computer by which an MR signal can be determined dependent on a naturally occurring second parameter of tissue in the examination subject, and said acquisition parameter;
   said MR signals being provided to said computer and computer being configured to determine a first subset of the MR signals for the first parameter and to determine a second subset of the MR signals for the second parameter, said first subset differing from said second subset;
   said computer being configured to execute a calculation algorithm that determines said first parameter so as to cause MR signals calculated using the first function to correspond as closely as possible to said MR signals of the first subset and that determines said second parameter to cause MR signals calculated using said second function to correspond as closely as possible to the MR signals of the second subset; and
   said computer being configured to generate at least one of a first numerical value representing said first parameter and a second numerical value representing said second parameter, and to present at least one of said first numerical value and said second numerical value at a display screen in communication with said computer.

17. A non-transitory, computer-readable data storage medium encoded with programming instructions for quantitative magnetic resonance (MR), said storage medium being loaded into a computer of an MR apparatus that comprises an MR scanner, and said programming instructions causing said computer to:
   generate control signals that define an MR data acquisition sequence and provide said control signals to said MR scanner in order to operate the MR scanner, while an examination subject is situated therein, so as to execute said MR data acquisition sequence to acquire MR signals from a volume of the examination subject using multiple values of an acquisition parameter;
   specify a first function by which an MR signal can be determined dependent on a naturally occurring first parameter of tissue in the examination subject, and said acquisition parameter;
   also specify a second function in said computer by which an MR signal can be determined dependent on a naturally occurring second parameter of tissue in the examination subject, and said acquisition parameter;
   determine a first subset of the MR signals for the first parameter and determine a second subset of the MR signals for the second parameter, said first subset differing from said second subset;
   execute a calculation algorithm that determines said first parameter so as to cause MR signals calculated using the first function to correspond as closely as possible to said MR signals of the first subset and that determines said second parameter to cause MR signals calculated using said second function to correspond as closely as possible to the MR signals of the second subset; and
   generate at least one of a first numerical value representing said first parameter and a second numerical value representing said second parameter, and present at least one of said first numerical value and said second numerical value at a display screen in communication with said computer.

* * * * *